United States Patent
Cho et al.

(10) Patent No.: US 11,658,214 B2
(45) Date of Patent: May 23, 2023

(54) MOSFET DEVICE WITH UNDULATING CHANNEL

(71) Applicant: SEMICONDUCTOR COMPONENTS INDUSTRIES, LLC, Phoenix, AZ (US)

(72) Inventors: Kevin Kyuheon Cho, Bucheon-si (KR); Bongyong Lee, Seoul (KR); Kyeongseok Park, Bucheon (KR); Doojin Choi, Gimpo-si (KR); Thomas Neyer, Munich (DE); Ki Min Kim, Seoul (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 89 days.

(21) Appl. No.: 17/248,160

(22) Filed: Jan. 12, 2021

(65) Prior Publication Data
US 2022/0223691 A1 Jul. 14, 2022

(51) Int. Cl.
*H01L 29/10* (2006.01)
*H01L 29/78* (2006.01)
*H01L 29/16* (2006.01)
*H01L 29/66* (2006.01)

(52) U.S. Cl.
CPC ...... *H01L 29/1608* (2013.01); *H01L 29/1045* (2013.01); *H01L 29/66068* (2013.01); *H01L 29/66712* (2013.01); *H01L 29/7802* (2013.01)

(58) Field of Classification Search
CPC ..... H01L 29/06; H01L 29/0696; H01L 29/08; H01L 29/0886; H01L 29/10; H01L 29/1033; H01L 29/1045; H01L 29/1095; H01L 29/16; H01L 29/1608; H01L 29/66; H01L 29/66068; H01L 29/66712; H01L 29/78; H01L 29/7802; H01L 29/7816
USPC .......................................................... 257/77
See application file for complete search history.

(56) References Cited

U.S. PATENT DOCUMENTS

| 5,844,277 | A | 12/1998 | Hshieh et al. |
| 10,388,735 | B2 | 8/2019 | Chun |
| 2010/0213517 | A1 | 8/2010 | Sonsky et al. |
| 2012/0193643 | A1 | 8/2012 | Masuda et al. |
| 2013/0009256 | A1* | 1/2013 | Okumura ............ H01L 29/0886 257/402 |

(Continued)

FOREIGN PATENT DOCUMENTS

JP 2007242925 A 9/2007

OTHER PUBLICATIONS

International Search Report and Written Opinion for PCT Application No. PCT/US2022/070083, dated May 9, 2022, 12 pages.

*Primary Examiner* — Fazli Erdem
(74) *Attorney, Agent, or Firm* — Brake Hughes Bellermann LLP

(57) ABSTRACT

A SiC MOSFET device with alternating p-well widths, including an undulating channel, is described. The undulating channel provides current paths of multiple widths, which enables optimization of on-resistance, transconductance, threshold voltage, and channel length. The multi-width p-well region further defines corresponding multi-width Junction FETs (JFETs). The multi-width JFETs enable improved response to a short-circuit event. A high breakdown voltage is obtained by distributing a high electric field in a JFET of a first width into a JFET of a second width.

16 Claims, 11 Drawing Sheets

(56) References Cited

U.S. PATENT DOCUMENTS

2019/0172930 A1   6/2019  Pendharkar et al.
2021/0143256 A1*  5/2021  Potera ................. H01L 29/7802

* cited by examiner

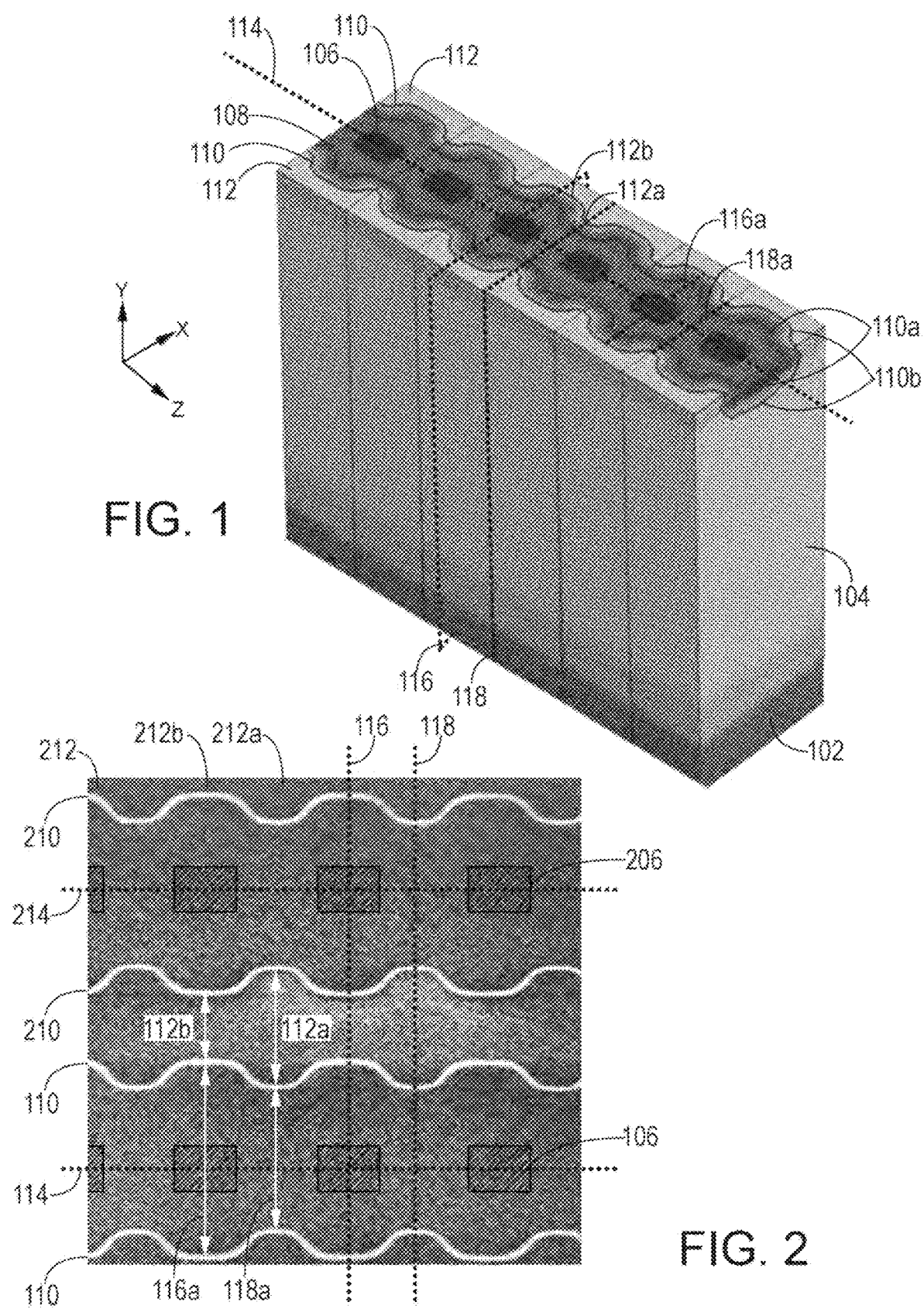

Perform P-well Implantation

Perform Pocket Implantation using Poly Spacers

Perform Source Region Implantation

Perform Island Implantation and Remove Mask/Spacers

MOSFET DEVICE WITH UNDULATING CHANNEL

TECHNICAL FIELD

This description relates to vertical metal oxide semiconductor field effect transistors (MOSFETs), including Silicon Carbide (SiC) MOSFETs.

BACKGROUND

Silicon carbide (SiC) metal-oxide-semiconductor field effect transistors (MOSFETs) may be characterized with respect to a safe operating area (SOA), which refers to voltage and/or current ranges over which such SiC MOSFETs are expected to operate without damage. It is possible to make SiC MOSFETs having advantageous features, such as a smaller size, lower power losses, and faster switching speeds, as compared to, e.g., silicon power devices of similar voltage rating.

However, it may be difficult to take full advantage of such features. For example, SiC MOSFETs used for switching applications may benefit from low on-resistance and high transconductance, but optimizing a SiC MOSFET for these parameters may reduce a corresponding SOA of the SiC MOSFET. In other examples, small sizes of SiC MOSFETs may also decrease ruggedness in response to short-circuit events.

SUMMARY

According to one general aspect, a Silicon Carbide (SiC) semiconductor device includes a substrate of a first conductivity type, a drift region of the first conductivity type disposed on the substrate, a channel region of a second conductivity type within the drift region and disposed along a longitudinal axis, and a source region of the first conductivity type disposed within the channel region. The SiC semiconductor device further includes a plurality of junction field effect transistor (JFET) regions between the channel region and the drift region, and gates disposed along the longitudinal axis and on at least a portion of the source region, the channel region, and the plurality of JFET regions. The SiC semiconductor device includes a first cross-sectional area orthogonal to the longitudinal axis, in which the channel region has a first width, and a second cross-sectional area orthogonal to the longitudinal axis, in which the channel region has a second width that is smaller than the first width.

According to another general aspect, a Silicon Carbide (SiC) semiconductor device includes a substrate of a first conductivity type, a drift region of the first conductivity type disposed on the substrate, and a channel region of a second conductivity type within the drift region, the channel region having an undulating channel edge. The SiC semiconductor device includes a source region disposed in the channel region, a plurality of junction field effect transistor (JFET) regions disposed between the channel region and the drift region, the plurality of JFET regions having widths that alternate in correspondence with undulations of the undulating channel edge, and at least one gate disposed on at least a portion of the source region, the channel region, and the plurality of JFET regions.

According to another general aspect, a method of making a SiC semiconductor device includes providing a drift region on a substrate, and implanting a channel region in the drift region and along a longitudinal axis, the channel region having alternating well (e.g., p-well) widths with respect to the longitudinal axis. The method further includes implanting a source region in the channel region, and providing at least one gate on at least a portion of the source region, at least a portion of the channel region, and on a plurality of junction field effect transistor (JFET) regions disposed between the channel region and the drift region, the plurality of JFET regions having alternating JFET widths that alternate in correspondence with the alternating well (e.g., p-well) widths.

The details of one or more implementations are set forth in the accompanying drawings and the description below. Other features will be apparent from the description and drawings, and from the claims.

BRIEF DESCRIPTION OF THE DRAWINGS

FIG. 1 is an isometric side view of a MOSFET device with an undulating channel edge.

FIG. 2 is a top view of an implementation of the MOSFET device of FIG. 1.

DETAILED DESCRIPTION

Figure 3:
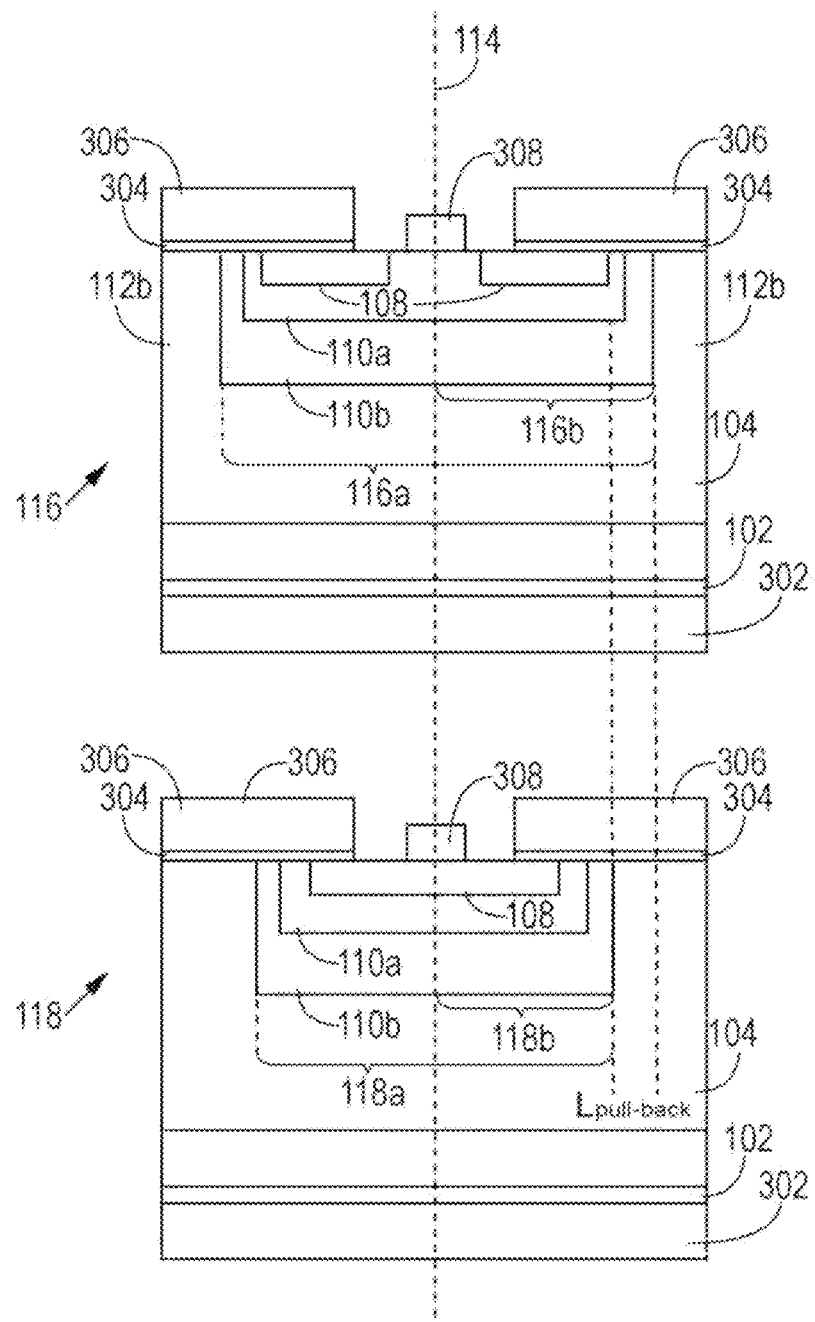
FIG. 3 illustrates two simplified cross-sectional views of the MOSFET device of FIG. 1.

The present disclosure describes a SiC MOSFET device having desired on-resistance and transconductance values, without requiring (or with minimizing of) a corresponding trade-off in either threshold voltage $V_{TH}$ or channel length of the SiC MOSFET device. As referenced above, low on-resistance and high transconductance may be desirable characteristics for a SiC MOSFET, but, in conventional devices, are associated with SOA reductions. It is possible to increase $V_{TH}$ and/or increase a channel length of a SiC MOSFET to maintain a desired SOA, but doing so typically offsets the desired on-resistance and transconductance values.

The present disclosure, in contrast, describes a SiC MOSFET device with multiple, e.g., alternating, p-well widths, including a SiC MOSFET device with an undulating or oscillating channel. The resulting channel provides current paths of multiple widths, which together circumvent the previously-required trade-offs between on-resistance and transconductance on one hand, and $V_{TH}$ and channel length on the other hand. As a result, for example, a SOA of the SiC MOSFET device may be maintained or improved, while providing low on-resistance and high transconductance, as well as small size and high switching speeds.

The multi-width p-well region further defines corresponding multi-width, e.g., alternating, Junction FETs (JFETs). The multi-width JFETs enable improved response to a short-circuit event, e.g., controlling a short circuit current. A high breakdown voltage is obtained by distributing a high electric field in a JFET of a first width into a JFET of a second width.

Described SiC MOSFET devices may be made using inexpensive, high-throughput techniques. Such techniques may be fine-tuned or otherwise optimized to enable obtaining of desired characteristics. In particular, a delta between a first p-well width and a second p-well width may be adjusted to obtain desired characteristics. For example, this delta may be directly proportional to $V_{TH}$, on-resistance, and breakdown voltage, while being inversely proportional to short-circuit current.

Thus, the described SiC MOSFET device provides ruggedness and reliability, while also providing superior performance characteristics during power switching, with a small form factor and reduced system cost. Such features are highly desirable in many applications, including, for example, electric motor control.

FIG. 1 is an isometric side view of a MOSFET device with an undulating channel. As shown in FIG. 1, a substrate 102 may have a drift region 104 disposed thereon. For example, at least a portion of an epitaxial layer formed on the substrate 102 provides a drift region, which may be, e.g., low-doped n-type. The drift region 104 may have thickness and doping values selected to support desired MOSFET operational characteristics.

Heavily-doped p-regions 106 are formed in lightly-doped p-region 110. Source region 108 is disposed within the heavily-doped p-region 106 and the lightly-doped p-region 110, as is more easily seen, for example, in the cross-sectional views of FIGS. 3 and 4. The source regions 108 may be, e.g, heavily doped n-type regions.

Accordingly, a MOSFET structure is formed which is commonly referred to as a vertical MOSFET structure, in which current flows from the source region 108, through the heavily-doped p-region 106, the lightly-doped p-region 110, and a junction field effect transistor (JFET) region 112 that is formed adjacent to the lightly-doped p-region 110. The MOSFET current proceeds through the drift region 104 to the substrate 102, at which a drain terminal (not shown in FIG. 1) is typically provided. Further, various types of gates or gate structures (and associated gate contacts) may be used to control the current flow, where examples of such gate structures and contacts are provided below, e.g., with respect to FIGS. 3, 4, and 5, but are not shown in FIGS. 1 and 2 for the sake of better illustrating (e.g., to avoid obscuring) the various features thereof described herein.

As the lightly-doped p-region 110 has the heavily-doped p-region 106 formed therein, an edge or boundary 110a exists therebetween, defining a distance or width between the boundary 110a and an outer edge 110b of the lightly-doped region 110. Such edges 110a, 110b are illustrated in simplified form in FIG. 3 for the sake of explanation, but it will be appreciated that, in practice and due to the nature of semiconductor processing, such edges are not discretely defined, as shown in FIG. 1, and in the more detailed example of FIG. 4.

Therefore, as shown and described below with respect to FIGS. 3 and 4, a channel region may include a heavily-doped current channel portion defined by a portion of the heavily-doped p-region 106 between the source region 108 and the boundary 110a of the lightly-doped region 110, as well as a lightly-doped current channel portion defined between the edges 110a, 110b. The heavily-doped p-regions 106 may provide body contacts where accessible within the source region(s) 108, and, as described with respect to FIGS. 6A-6D, may be provided in multiple processing steps.

In FIG. 1, a vertical direction of current flow in the vertical MOSFET structure is thus understood to occur in a direction of a y-axis shown in the included legend. A lateral direction along an x-axis is also illustrated that is perpendicular to the y-axis, while a z-axis defines a direction along a longitudinal axis 114 running through the heavily-doped p-region(s) 106. Cross section 116 is taken as an x-y cross section that is orthogonal to the longitudinal axis 114, and illustrated in more detail in FIGS. 3 and 4, while cross section 118 is taken as an x-y cross section that is orthogonal to the longitudinal axis 114, and illustrated in more detail in FIG. 3.

In FIG. 1, the channel edge 110b extends varying distances along the x-axis and perpendicular to the longitudinal axis 114. Thus, the channel edge 110 may be described as providing an undulating or oscillating channel edge. As described herein, the undulating channel edge 110b provides additional current paths, as compared to, for example, a straight or striped channel edge. The additional current paths enable a low specific on-resistance ($R_{sp}$), without sacrificing SOA.

In particular, the undulating channel edge 110 results in the JFET region 112 having a wide JFET region 112a and a narrow JFET region 112b. That is, as is more easily seen, for example, in FIG. 2, the MOSFET device of FIG. 1 may be formed using at least two adjacent implementations of the structure of FIG. 1, so that n-type regions formed therebetween effectively provide an n-type JFET region in the drift region 104, with surrounding p-type regions providing a gating function for such JFET regions. During periods of high current flow, particularly for suddenly high current flows occurring during a short-circuit event, the dual gating function of such JFET regions leads to a pinch-off effect that limits, restricts, or prevents corresponding short-circuit currents that might otherwise damage the MOSFET device of FIG. 1. Moreover, the alternating wide JFET regions 112a and narrow JFET regions 112b provide such short-circuit current limiting effects without sacrificing a desired, low specific on-resistance ($R_{sp}$).

The alternating wide JFET regions 112a and narrow JFET regions 112b corresponding to, and defined by, the undulating nature of the channel edge 110b provide additional advantages as well. Thus, a plurality of junction field effect transistor (JFET) regions 112a, 112b are disposed between the channel region and the drift region, with the plurality of JFET regions 112a, 112b having widths that alternate in correspondence with undulations of the undulating channel edge 110b. As a result, for example, a device breakdown voltage may be increased due to a distribution of electric fields in the wide JFET regions 112a into the narrow JFET regions 112b.

In the present description, the relative terms wide/narrow should be understood to be with respect to one another, such that the wide JFET regions 112a are wider than the narrow JFET regions 112b. Examples of extents of differences (deltas) between the wide JFET regions 112a and the narrow JFET regions 112b are provided below, e.g., in the contact of the parameter $L_{pull-back}$.

FIG. 2 illustrates a top view of two adjacent implementations of the structure of FIG. 1, with reference numerals of FIG. 1 (in the 1xx series) therefore being repeated with respect to the corresponding (lower) top view thereof. Reference numerals in a 2xx series correspond to the same or similar aspects in the second implementation. Consequently, FIG. 2 illustrates heavily-doped p region 206, lightly-doped p-region 210, JFET region 212 (including wide JFET region 212a and narrow JFET region 212b), and a longitudinal axis 214 (source region 108 and corresponding source region 208 are not illustrated in FIG. 2 for the sake of simplicity).

FIG. 2 thus illustrates that the wide JFET region 112a and narrow JFET region are defined between two adjacent lightly-doped p-regions 110, 210 of adjacent MOSFET devices. As also shown in FIG. 1, an edge-to-edge distance 116a may be defined between outer edges of the lightly-doped p-region 110 along an x direction of the cross-section 116 (adjacent to the narrow JFET region 112b), while an edge-to-edge distance 118a may be defined between outer edges of the lightly-doped p-region 110 along an x direction of the cross-section 118 (adjacent to the wide JFET region 112a).

FIG. 3 illustrates two simplified cross-sectional views of the MOSFET device of FIG. 1, corresponding to cross-sections 116, 118 of FIG. 1. In FIG. 3, drain terminal 302 is illustrated, as well as gate oxide 304 and gates 306. A contact line 308 is illustrated in cross-section as well. Further details of example implementations of the gate structures 304, 306 and contact line 308 are provided below, e.g., with respect to FIG. 5.

FIG. 3 illustrates that a distance (edge-to-edge width) 116a of the channel edge 110b at cross-section 116 is greater than a distance (edge-to-edge width) 118a of the channel edge 110b at cross-section 118. A distance (center-to-edge width) 116b from the longitudinal axis 114 is correspondingly greater than a distance (center-to-edge width) 118b from the longitudinal axis 114.

In particular, a distance labeled $L_{pull-back}$ represents a delta between the distance 116b and the distance 118b. Correspondingly $L_{pull-back}$ may be referred to as a delta between a half-width of the wide JFET region 112a and a half-width of the narrow JFET region 112b, as shown in FIG. 3 and with reference to FIG. 2.

Figure 4:
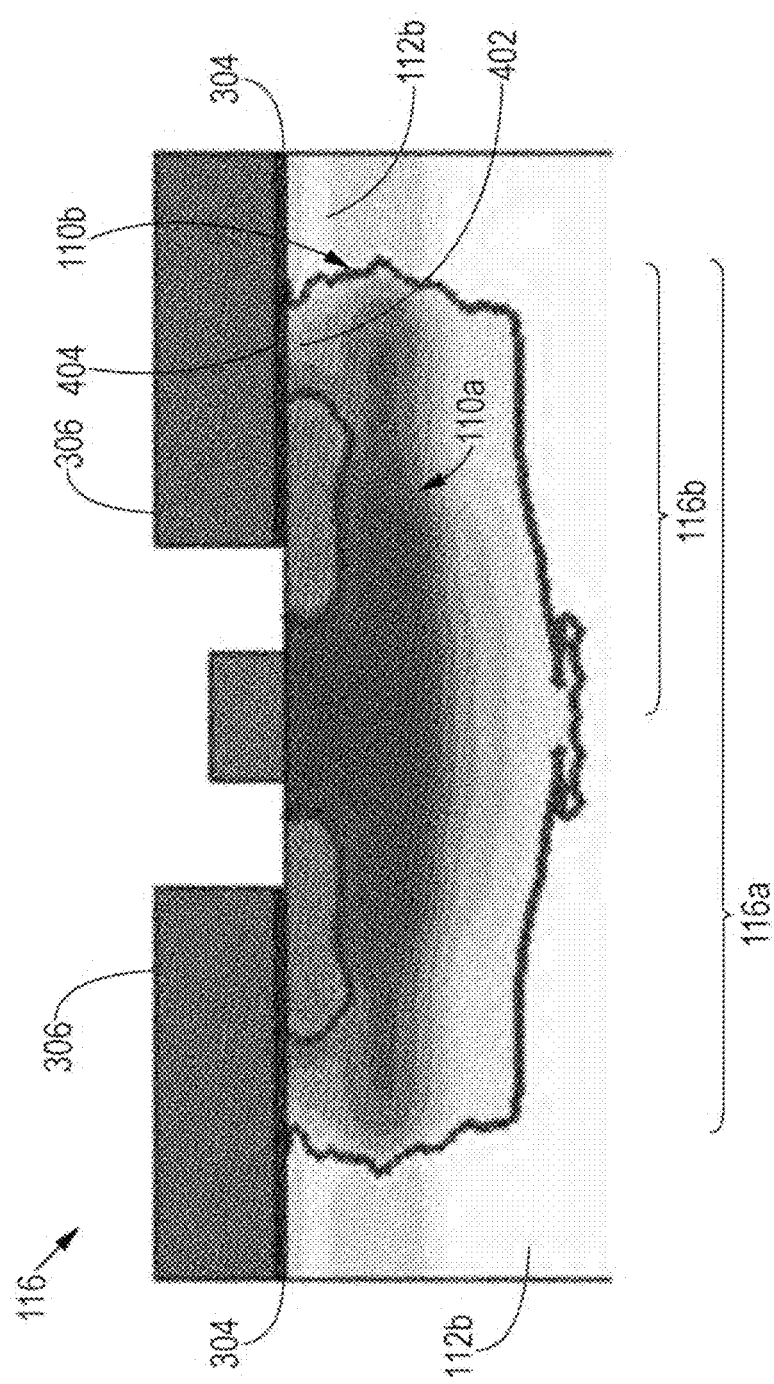
FIG. 4 is a more detailed cross-sectional view of the MOSFET device of FIG. 1.

FIG. 4 is a more detailed illustration of the cross-sectional view 116 of the MOSFET device of FIG. 1. FIG. 4 illustrates that a lightly-doped channel region 402 exists between the boundary 110a and the channel edge 110b, while a heavily-doped channel region 404 exists between the boundary 110a and the source region 108. As referenced above, FIG. 4 also illustrates a diffused nature of the lightly-doped channel region 402, the heavily-doped channel region 404, and the boundary 110a therebetween.

Figure 5:
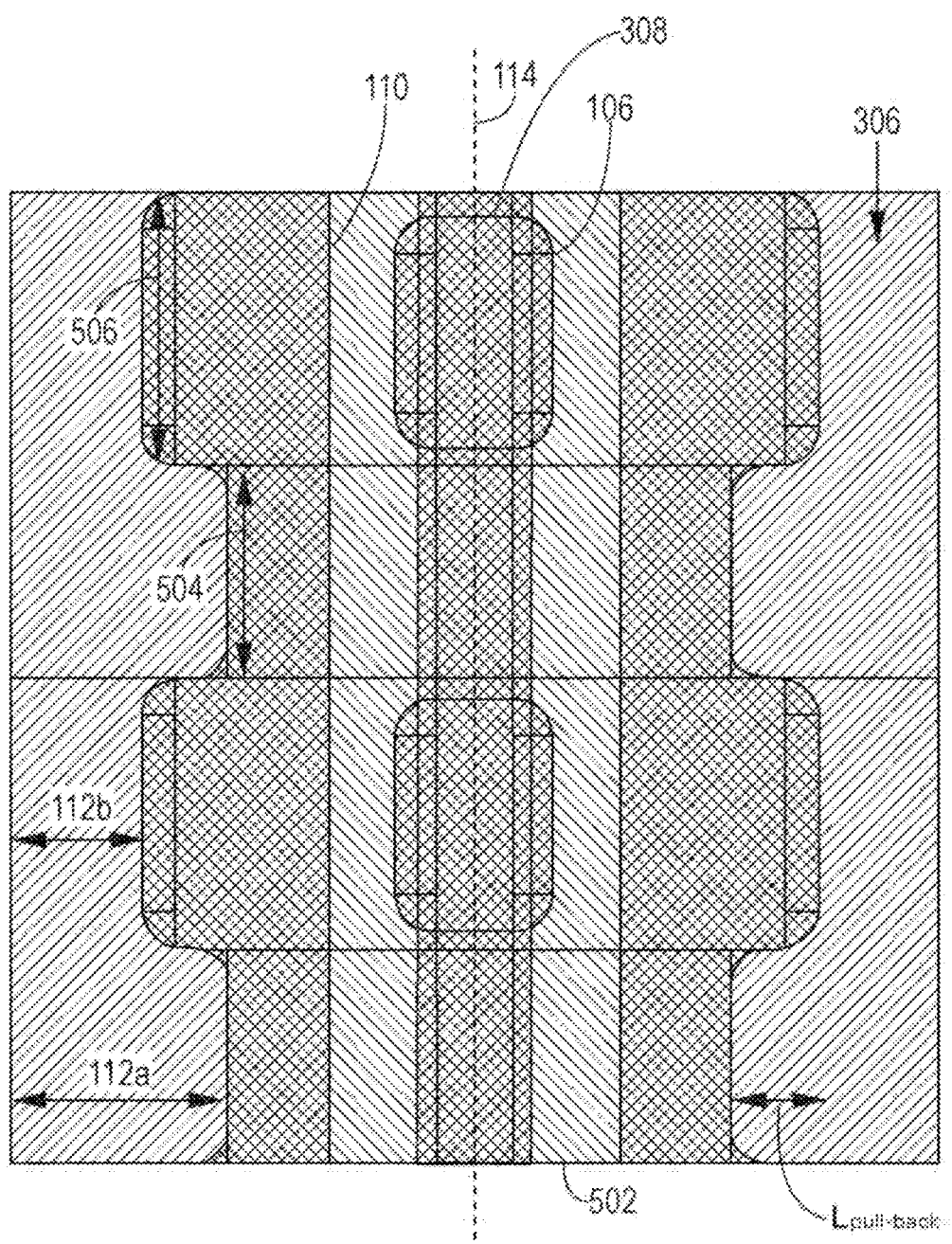
FIG. 5 is a top view of a more detailed example implementation of the MOSFET device of FIG. 1.

FIG. 5 is a top view of a more detailed example implementation of the MOSFET device of FIG. 1. FIG. 5 illustrates that the gate 306 is disposed along the longitudinal axis 114 with a gate contact 308 disposed therebetween, as already illustrated and described with respect to FIGS. 3 and 4. Dielectric 502 is disposed between the gate 306 and the contact 308.

FIG. 5 further illustrates the wide JFET region 112a and the narrow JFET region 112b. As also already described, the delta between these values may be referenced as the illustrated $L_{pull-back}$ parameter. Additional characteristic parameters include a longitudinal JFET length 504 of the wide JFET region 112a, and a longitudinal JFET length 506 of the narrow JFET region 112b.

Figure 6A:
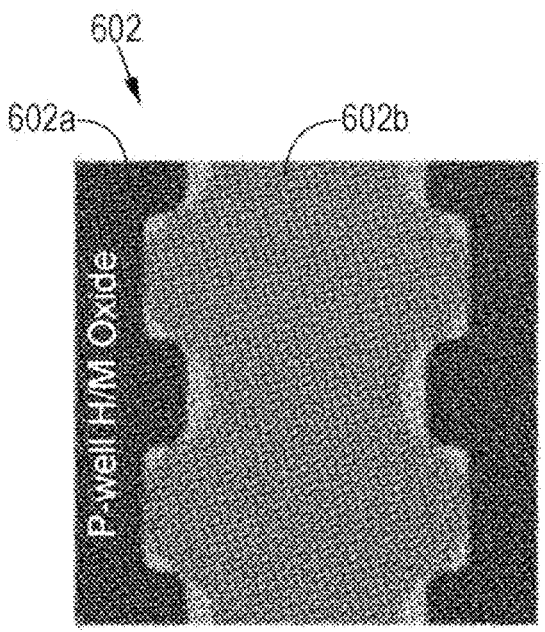
FIGS. 6A-6D illustrate an example process flow for making the MOSFET device of FIG. 1.

FIGS. 6A-6D illustrate an example process flow for making the MOSFET device of FIG. 1. In FIG. 6A, the illustrated process flow begins with performing channel implantation (602), e.g., using ion implantation (IIP). As shown, a hard mask oxide 602a may be used that has an opening corresponding to desired parameters for the resulting p-implantation well 602b, including a desired $L_{pull-back}$, as described and illustrated above.

Figure 6B:
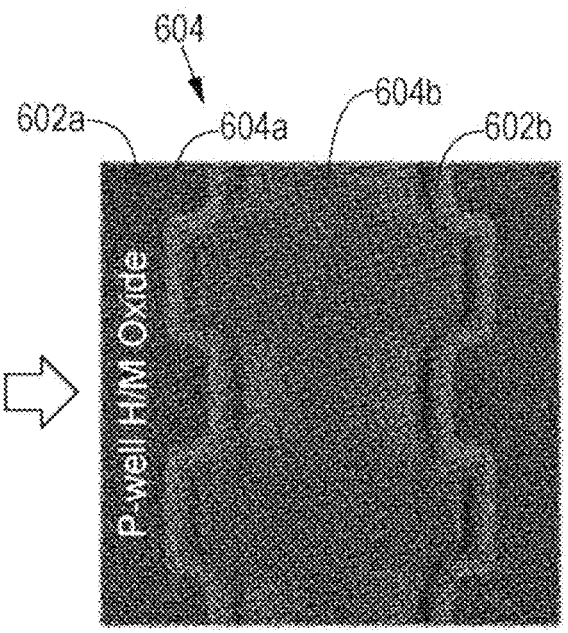

In FIG. 6B, pocket implantation is performed using a spacer (e.g., a polysilicon spacer) 604a (604). As a result, higher doping p-well region 604b is formed, relative to lower-doped p-regions 602b. The p-well region(s) 604b may be referred to as pocket implantation regions, and contribute to the heavily-doped channel region 404 of FIG. 4, as compared to the lightly-doped channel region 402 of FIG. 4 (provided by the p-regions 602b).

Figure 6C:
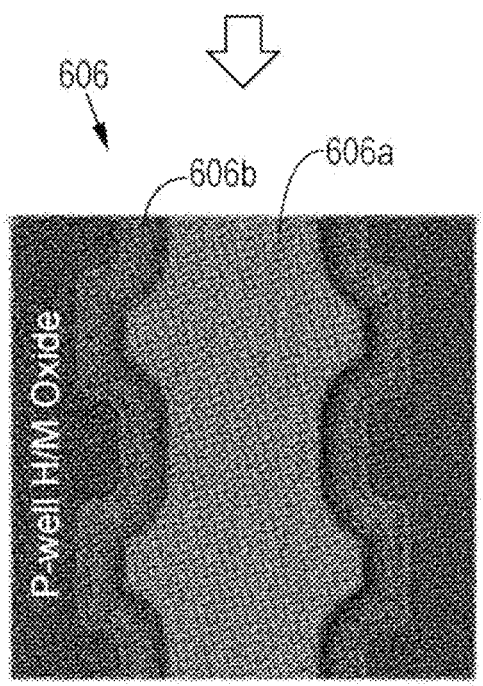

In FIG. 6C, implantation is performed for source region 606a (606), of opposite conductivity type than the regions 602b, 604b, e.g., n-type conductivity. Updated spacers 606b may be used to obtain a desired size and shape of the source region 606a.

Figure 6D:
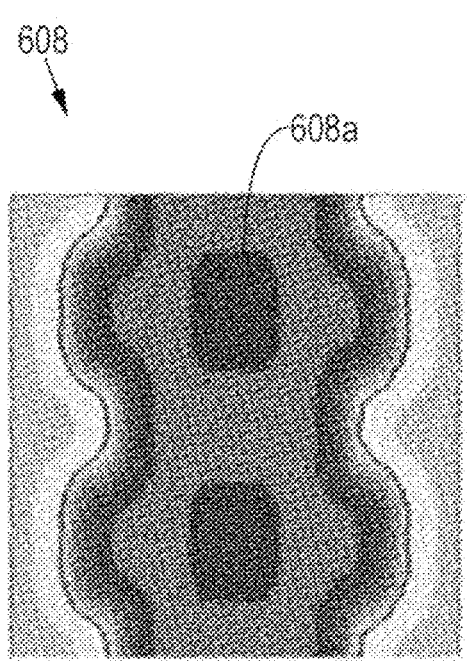

In FIG. 6D, p-type island regions 608a are formed, and the hard mask oxide 602a and spacer(s) 604a/606b are removed to obtain a final structure of FIG. 1 (608). As referenced above, the p-type island regions 608a may provide body contacts within the heavily-doped p-region(s) 106 of FIG. 1.

Figure 8:
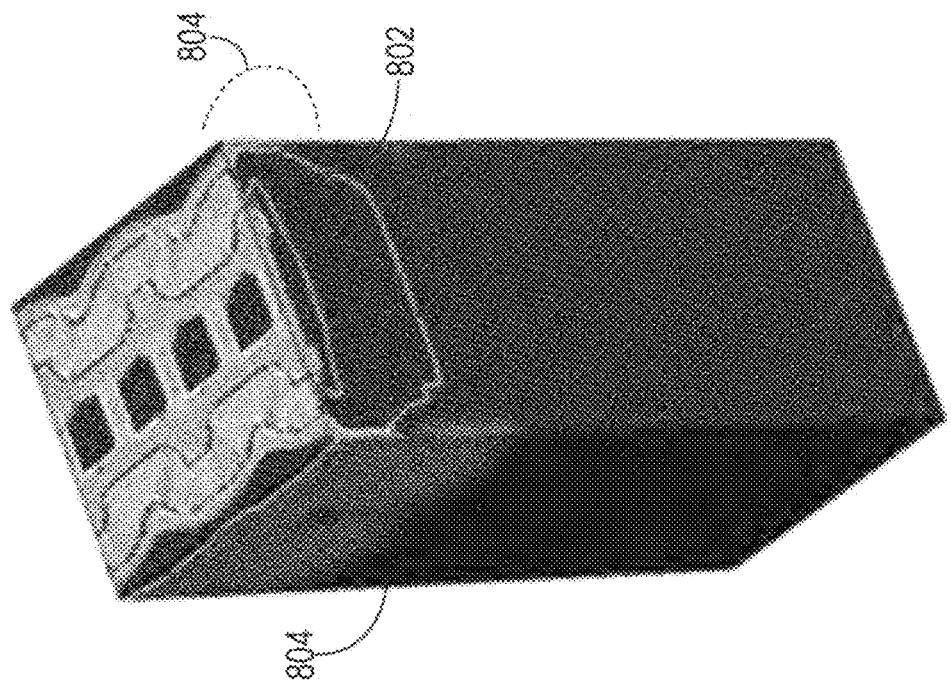
FIG. 8 illustrates an isometric view of the implementation of the MOSFET device of FIG. 17, including a second current density distribution.
Figure 7:
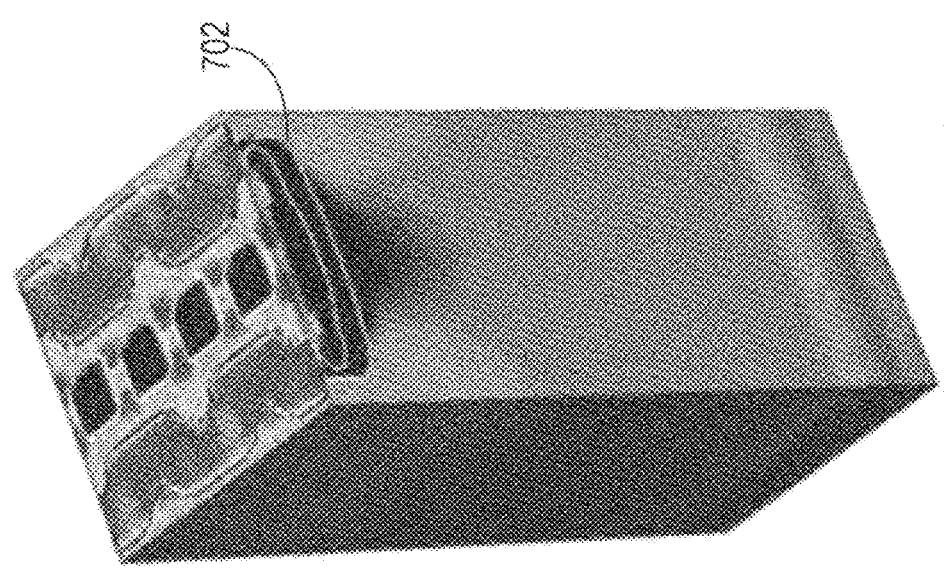
FIG. 7 illustrates an isometric view of an implementation of the MOSFET device of FIG. 1, including a first current density distribution.

FIG. 7 illustrates an isometric view of an implementation of the MOSFET device of FIG. 1, including a first current density distribution. FIG. 8 illustrates an isometric view of the implementation of the MOSFET device of FIG. 17, including a second current density distribution. In both FIGS. 7 and 8, $V_{GS}$ is held constant (e.g., at 18V), while in FIG. 7 $V_{DS}$ is a low value (e.g., at or below 1V), while in FIG. 8, $V_{DS}$ is at a relatively higher voltage (e.g., 10-80V or higher, e.g., 65V).

FIG. 7 illustrates a depletion region 702, while FIG. 8 illustrates a depletion region 802. As shown, the depletion region 802 is considerably expanded in comparison to the depletion region 702 of FIG. 7, due to the relatively higher value of $V_{DS}$ in FIG. 8. As a result, the depletion region 802 extends to regions 804, thereby preventing current flow in the regions 804. Accordingly, as referenced above, short-circuit current protection is provided, as current is unable to flow in the regions 804 due to the expansion of the depletion region 802. Put another way, the regions 804 correspond to narrow JFET regions in which current saturation is reached prior to short-circuit breakdown.

Figure 9:
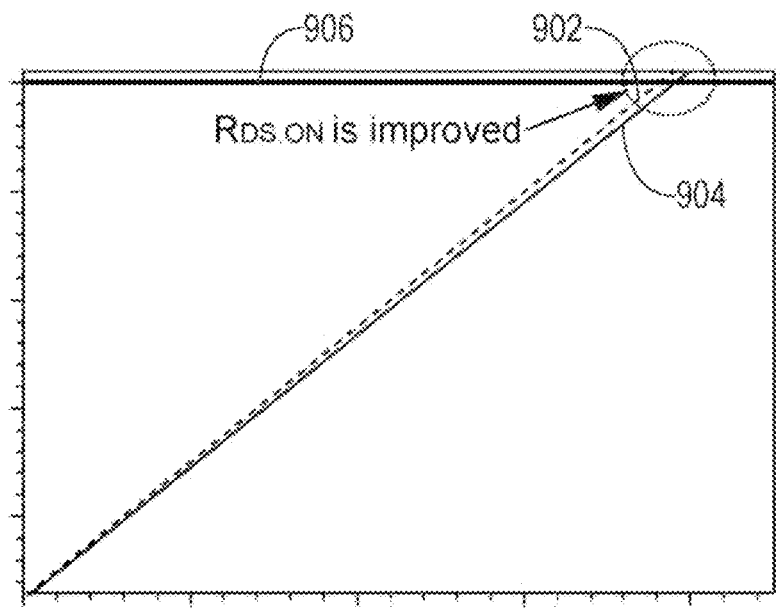
FIG. 9 is a graph illustrating a current-voltage characteristic of the example of FIG. 7.
Figure 10:
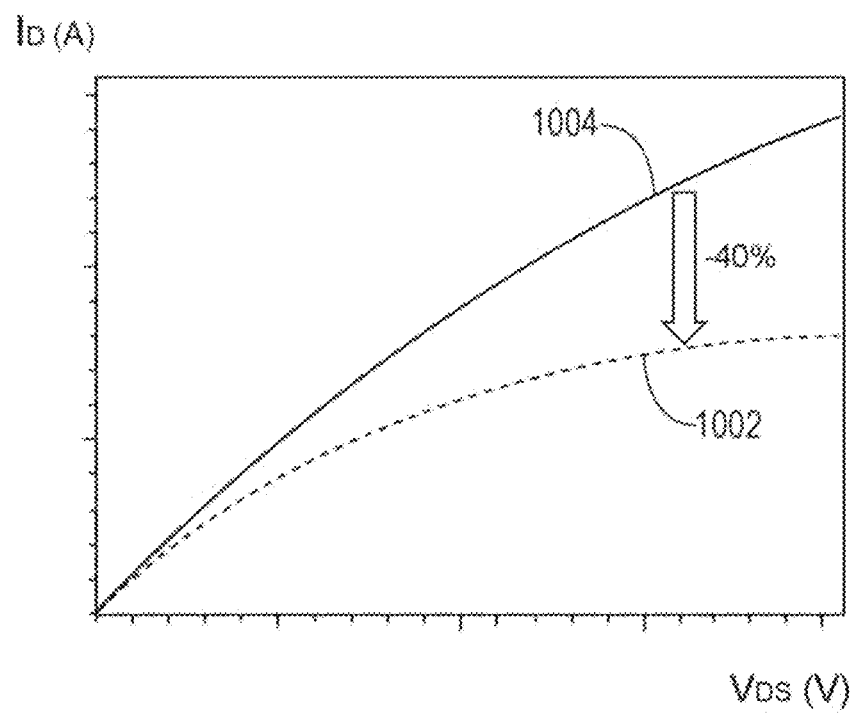
FIG. 10 is a graph illustrating a current-voltage characteristic of the example of FIG. 8.

FIG. 9 is a graph illustrating a current-voltage characteristic of the example of FIG. 7. FIG. 10 is a graph illustrating a current-voltage characteristic of the example of FIG. 8.

In FIG. 9, line 902 indicates a current-voltage characteristic for the implementation of FIG. 7, in which drain current changes over a low, small voltage range of $V_{DS}$, such as, e.g., less than 1V. The line 904 provides a similar type of current-voltage characteristic for a comparison device having a straight or uniform channel, as compared to the undulating channel of FIGS. 1, 7, and 8.

As shown, the resulting $R_{DS\text{-}ON}$ characteristics defined by the current/voltage relationship provides a value of $R_{DS\text{-}ON}$ 906 for the implementation of FIG. 7 that is lower than that of the comparison device.

Meanwhile, in FIG. 10, a line 1002 corresponds to the implementation of FIG. 8, while line 1004 corresponds to the comparison device referenced above. As shown, as a result of the depletion region 802 extending into the regions 804, the current of the line 1002 saturates faster and at a much lower value of $V_{DS}$ then the reference device.

Figure 11:
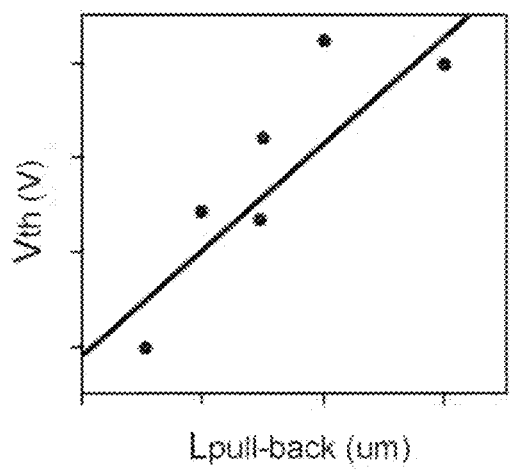
FIG. 11 is a graph illustrating example changes in threshold voltage with extent of delta $L_{pull-back}$ in the undulating channel of example implementations of FIG. 1.

FIG. 11 is a graph illustrating example changes in threshold voltage with extent of delta $L_{pull\text{-}back}$ in the undulating channel of example implementations of FIG. 1. FIG. 11 illustrates that increases in $L_{pull\text{-}back}$ correspond to increases in threshold voltage.

Figure 12:
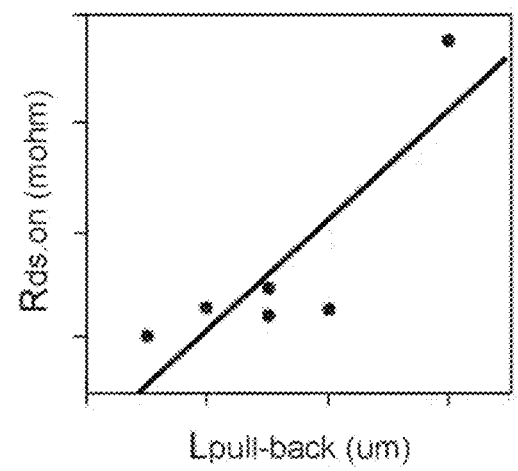
FIG. 12 is a graph illustrating example changes in specific on-resistance with extent of delta $L_{pull-back}$ in the undulating channel of example implementations of FIG. 1.

FIG. 12 is a graph illustrating example changes in specific on-resistance with extent of delta $L_{pull\text{-}back}$ in the undulating channel of example implementations of FIG. 1. FIG. 12 illustrates that increases in $L_{pull\text{-}back}$ correspond to increases in $R_{DS\text{-}ON}$.

Figure 13:
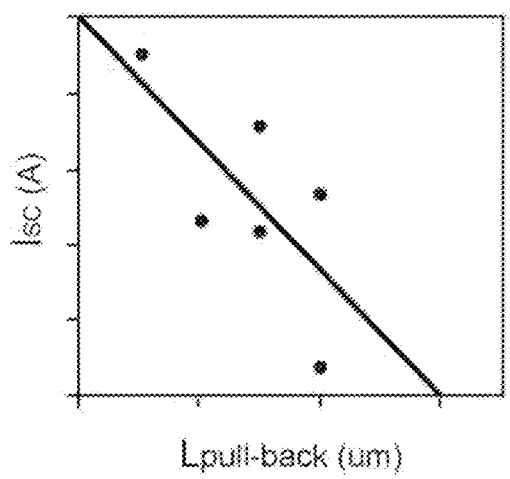
FIG. 13 is a graph illustrating example changes in short circuit current $I_{sc}$ with extent of delta $L_{pull-back}$ in the undulating channel of example implementations of FIG. 1.

FIG. 13 is a graph illustrating example changes in short circuit current $I_{sc}$ with extent of delta $L_{pull\text{-}back}$ in the undulating channel of example implementations of FIG. 1. FIG. 13 indicates that increases in $L_{pull\text{-}back}$ correspond to decreases in short circuit current $I_{SC}$.

Figure 14:
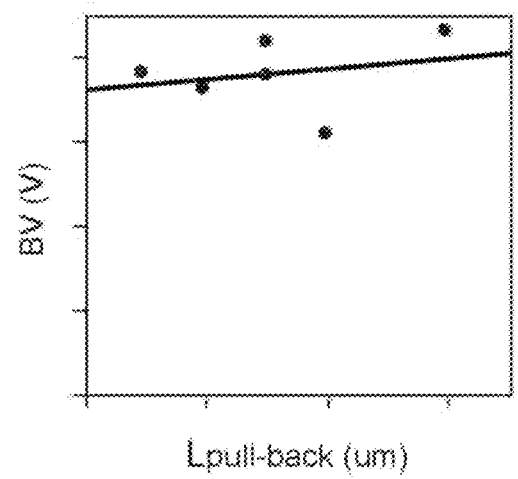
FIG. 14 is a graph illustrating example changes in breakdown voltage (BV) with extent of delta $L_{pull-back}$ in the undulating channel of example implementations of FIG. 1.

FIG. 14 is a graph illustrating example changes in breakdown voltage (BV) with extent of delta $L_{pull\text{-}back}$ in the undulating channel of example implementations of FIG. 1. FIG. 14 illustrates that increases in $L_{pull\text{-}back}$ correspond to stable breakdown voltages, because high electric fields in the wide JFET regions that might otherwise lead to breakdown events can be distributed to adjacent narrow JFET regions.

Figure 15:
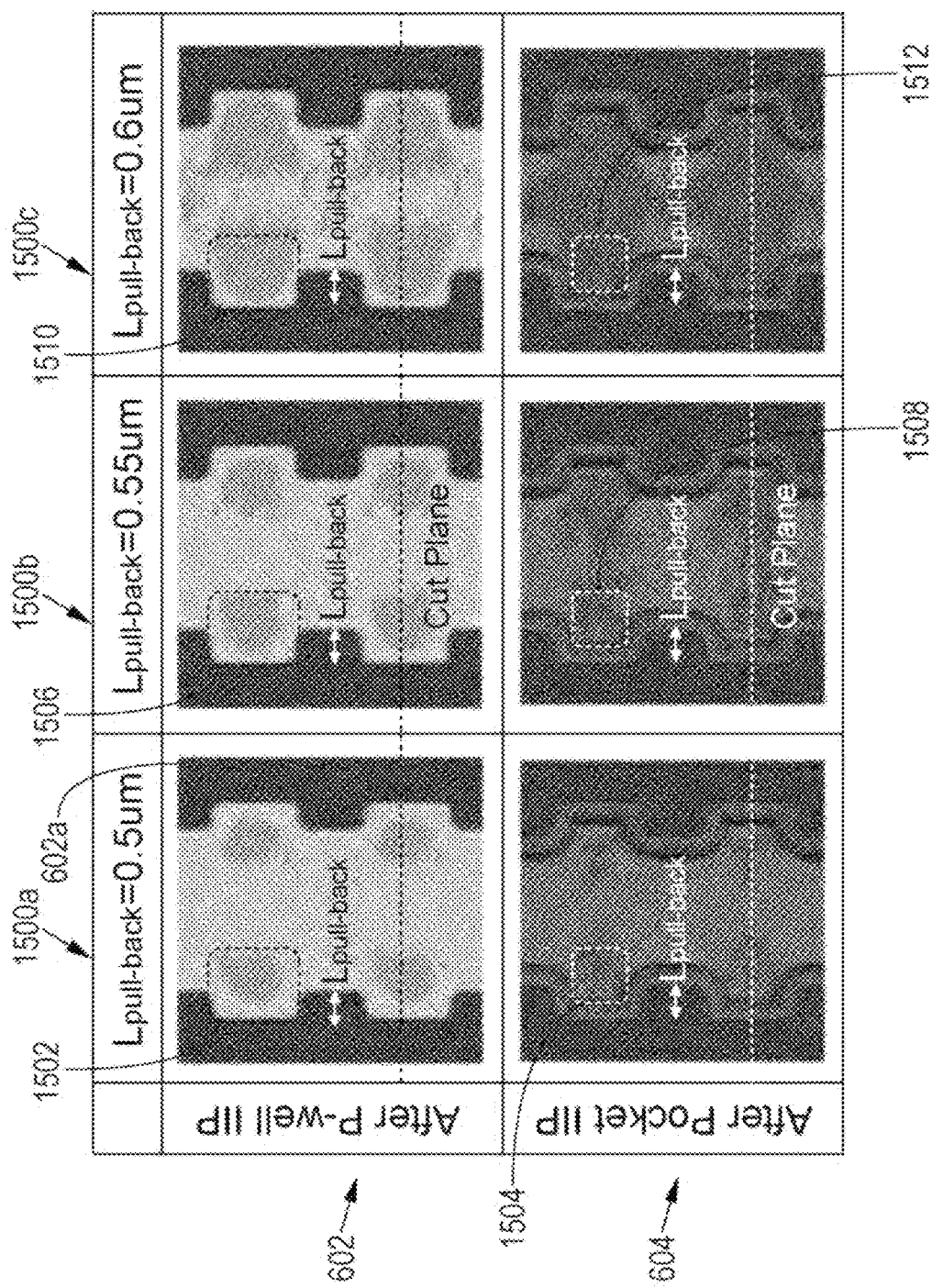
FIG. 15 illustrates example doping profiles at multiple processing stages and variations thereof with respect to extent of delta $L_{pull-back}$ in the undulating channel of example implementations of FIG. 1.

FIG. 15 illustrates example doping profiles at multiple processing stages and variations thereof with respect to extent of delta $L_{pull\text{-}back}$ in the undulating channel of example implementations of FIG. 1. In particular, FIG. 15 illustrates examples of the processing stages 602, 604 of FIGS. 6A and 6B, for three different, increasing values of $L_{pull\text{-}back}$.

At a first value of $L_{pull\text{-}back}$ 1500*a*, regions 1502 and 1504 exhibit a degree of dopant concentration. For example, the implanted p-type dopants (e.g., Aluminum (Al) dopants), exhibit the illustrated degree of concentration in regions adjacent to narrow JFET regions. For example, dopant concentration in the region 1502 may occur as a result of scattering and reflection of the implanted dopants from the hard mask oxide 602*a*.

At a second value of $L_{pull\text{-}back}$ 1500*b*, increased from 1500*a*, these effects of increased doping concentrations in regions 1506 and 1508 are increased. At a third value of $L_{pull\text{-}back}$ 1500*c*, increased from 1500*b*, these effects of increased doping concentrations in regions 1510 and 1512 are increased further.

Thus, in general, increased values or extends of $L_{pull\text{-}back}$ result in increase of doping concentrations in the indicated regions. These increased doping concentrations increase the heavily doped channel regions discussed above, such as heavily-doped channel region 404 of FIG. 4, and are consistent with the characteristic relationships between $L_{pull\text{-}back}$ and $V_{th}$, $R_{DSon}$, $I_{sc}$, and BV shown in FIGS. 11-14, respectively, as described above.

Figure 16:
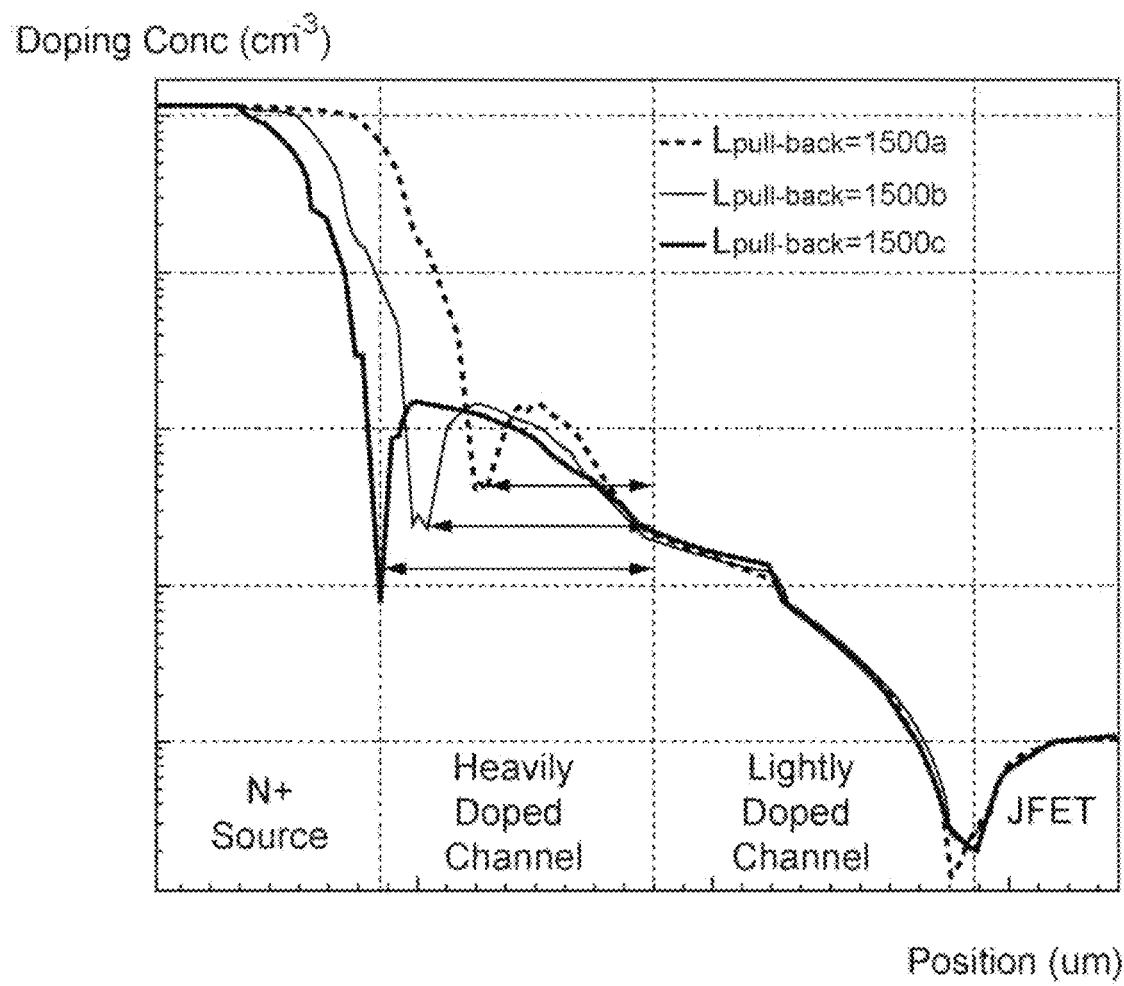
FIG. 16 is a graph illustrating resulting doping concentrations in example implementations of the structure of FIG. 1, using the example values from FIG. 15 for delta $L_{pull-back}$ in the undulating channel.

FIG. 16 is a graph illustrating resulting doping concentrations in example implementations of the structure of FIG. 1, using the example values 1500*a*, 1500*b*, 1500*c* from FIG. 15 for delta $L_{pull\text{-}back}$ in the undulating channel. FIG. 16 is taken across the cut plane illustrated in FIG. 15, and demonstrates the relative increase in doping concentration within the heavily-doped channel region for the highest value 1500*c* of $L_{pull\text{-}back}$.

Figure 17:
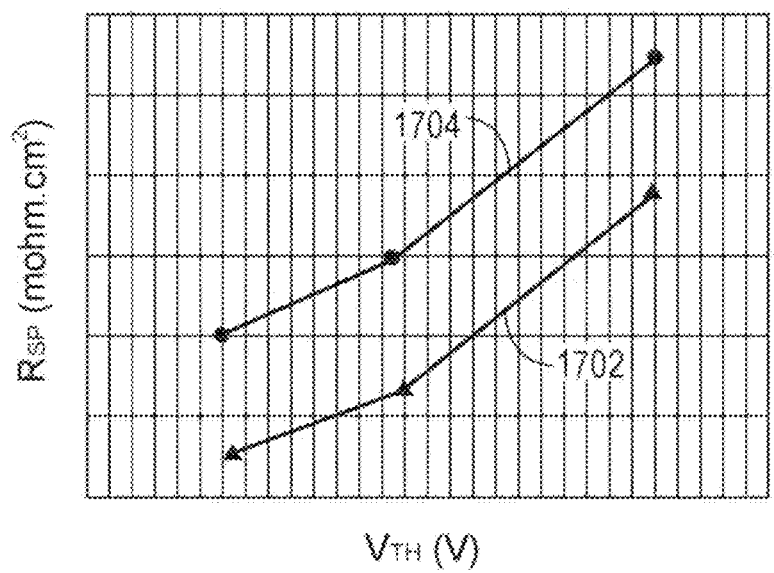
FIG. 17 is a graph illustrating specific on-resistance as a function of threshold voltage for an example implementation of FIG. 1.

FIG. 17 is a graph illustrating specific on-resistance as a function of threshold voltage for an example implementation of FIG. 1. In FIG. 17, a line 1702 illustrates values of $R_{Spon}$ for implementations of FIG. 1, while a line 1704 illustrates values of $R_{Spon}$ for a comparison device with a straight, not undulating channel. As shown, the line 1702 indicates that $R_{Spon}$ values are lower across a range of threshold voltages for the implementation of FIG. 1.

Figure 18:
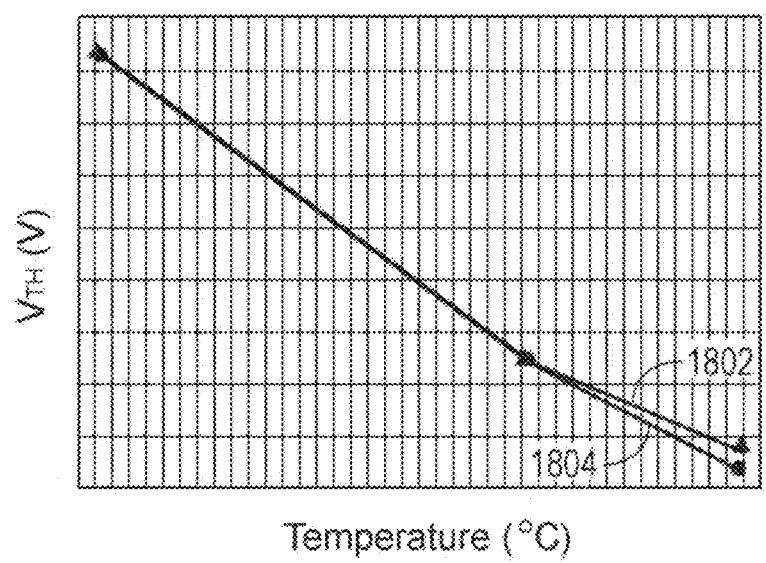
FIG. 18 is a graph illustrating threshold voltage as a function of temperature for an example implementation of FIG. 1.

FIG. 18 is a graph illustrating threshold voltage as a function of temperature for an example implementation of FIG. 1. As shown, line 1802 corresponding to implementations of FIG. 1 are consistent with line 1804 for the comparison device of FIG. 17. Accordingly, FIG. 18 illustrates that implementations of FIG. 1 do not suffer from decreased temperature performance.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A Silicon Carbide (SiC) semiconductor device, comprising:
   a substrate of a first conductivity type;
   a drift region of the first conductivity type and having a first doping concentration disposed on the substrate;
   a channel region of a second conductivity type within the drift region and disposed along a longitudinal axis;
   a source region of the first conductivity type disposed within the channel region;
   a plurality of junction field effect transistor (JFET) regions between the channel region and the drift region, the plurality of JFET regions being of the first conductivity type and having a second doping concentration that is greater than the first doping concentration of the drift region;
   gates disposed along the longitudinal axis and on at least a portion of the source region, the channel region, and the plurality of JFET regions;
   a first cross-sectional area orthogonal to the longitudinal axis, in which the channel region has a first width; and
   a second cross-sectional area orthogonal to the longitudinal axis, in which the channel region has a second width that is smaller than the first width,
   wherein the channel region includes a heavily-doped channel region between the source region and a lightly-doped channel region of the channel region, and the lightly-doped channel region is between the heavily-doped channel region and a JFET region of the plurality of JFET regions.

2. The SiC semiconductor device of claim 1, wherein the plurality of JFET regions comprises:
   a first JFET region within the first cross-sectional area having a first JFET width; and
   a second JFET region within the second cross-sectional area having a second JFET width that is wider than the first JFET width.

3. The SiC semiconductor device of claim 2, wherein, during operation of the SiC semiconductor device, an electric field in the second JFET region is distributed into the first JFET region.

4. The SiC semiconductor device of claim 1, wherein the channel region includes an undulating channel edge along a direction of the longitudinal axis.

5. The SiC semiconductor device of claim 1, comprising:
   a plurality of body contact regions of the second conductivity type disposed within the source region and along the longitudinal axis.

6. The SiC semiconductor device of claim 1, wherein a delta between the first width and the second width is at least 0.5 microns.

7. The SiC semiconductor device of claim 1, wherein the SiC semiconductor device includes at least one Metal Oxide Semiconductor Field Effect Transistor (MOSFET), and further comprising a drain terminal of the MOSFET on which the substrate is disposed.

8. A Silicon Carbide (SiC) semiconductor device, comprising:
   a substrate of a first conductivity type;
   a drift region of the first conductivity type and having a first doping concentration disposed on the substrate;
   a channel region of a second conductivity type within the drift region, the channel region having an undulating channel edge;
   a source region disposed in the channel region;
   a plurality of junction field effect transistor (JFET) regions disposed between the channel region and the drift region, the plurality of JFET regions having widths that alternate in correspondence with undulations of the undulating channel edge; and
   at least one gate disposed on at least a portion of the source region, the channel region, and the plurality of JFET regions,
   wherein the channel region includes a heavily-doped channel region between the source region and a lightly-doped channel region of the channel region, and the lightly-doped channel region is between the heavily-doped channel region and a JFET region of the plurality of JFET regions.

9. The SiC semiconductor device of claim 8, wherein, during operation of the SiC semiconductor device, an electric field in a JFET region of the plurality of JFET regions is distributed into an adjacent JFET region of the plurality of JFET regions.

10. The SiC semiconductor device of claim 8, wherein a delta between adjacent ones of the alternating widths of the plurality of JFET regions is at least 0.5 microns.

11. The SiC semiconductor device of claim 8, wherein the SiC semiconductor device includes at least one Metal Oxide Semiconductor Field Effect Transistor (MOSFET), and further comprising a drain terminal of the MOSFET on which the substrate is disposed.

12. A Silicon Carbide (SiC) semiconductor device, comprising:
   a substrate;
   a drift region of the first conductivity type and having a first doping concentration disposed on the substrate;
   a channel region of a second conductivity type within the drift region, the channel region having an undulating channel edge along a longitudinal axis;
   a source region of the first conductivity type disposed within the channel region;
   a plurality of junction field effect transistor (JFET) regions between the channel region and the drift region, the plurality of JFET regions having widths that alternate in correspondence with undulations of the undulating channel edge, the plurality of JFET regions being of the first conductivity type and having a second doping concentration that is greater than the first doping concentration of the drift region;
   gates disposed along the longitudinal axis and on at least a portion of the source region, the channel region, and the plurality of JFET regions;
   a first cross-sectional area orthogonal to the longitudinal axis, in which the channel region has a first width; and
   a second cross-sectional area orthogonal to the longitudinal axis, in which the channel region has a second width that is smaller than the first width,
   wherein the channel region includes a heavily-doped channel region between the source region and a lightly-doped channel region of the channel region, and the lightly-doped channel region is between the heavily-doped channel region and a JFET region of the plurality of JFET regions.

13. The SiC semiconductor device of claim 12, wherein the plurality of JFET regions comprises:
   a first JFET region within the first cross-sectional area having a first JFET width; and
   a second JFET region within the second cross-sectional area having a second JFET width that is wider than the first JFET width.

14. The SiC semiconductor device of claim 13, wherein, during operation of the SiC semiconductor device, an electric field in the second JFET region is distributed into the first JFET region.

15. The SiC semiconductor device of claim 12, wherein a delta between the first width and the second width is at least 0.5 microns.

16. The SiC semiconductor device of claim 12, wherein the SiC semiconductor device includes at least one Metal Oxide Semiconductor Field Effect Transistor (MOSFET), and further comprising a drain terminal of the MOSFET on which the substrate is disposed.

\* \* \* \* \*